United States Patent [19]

Mariani et al.

[11] Patent Number: 4,639,695
[45] Date of Patent: Jan. 27, 1987

[54] WIDEBAND SAW CHANNELLIZER USING SLANTED ARRAY INPUT TRANSDUCER

[75] Inventors: Elio A. Mariani, Hamilton Square; William J. Skudera, Jr., Eatontown, both of N.J.

[73] Assignee: The United States of America as represented by the Secretary of the Army, Washington, D.C.

[21] Appl. No.: 749,038

[22] Filed: Jun. 25, 1985

[51] Int. Cl.$^4$ .............................................. H03H 9/72
[52] U.S. Cl. ..................................... 333/133; 333/193
[58] Field of Search ............... 333/133, 193, 150, 151; 310/313 B

[56] References Cited

U.S. PATENT DOCUMENTS

| | | | |
|---|---|---|---|
| 3,800,247 | 3/1974 | Tancrell et al. | 333/151 |
| 4,024,480 | 5/1977 | Reeder et al. | 333/193 X |
| 4,114,116 | 9/1978 | Reeder | 333/150 |
| 4,188,596 | 2/1980 | Miura | 333/151 |
| 4,499,393 | 2/1985 | Stokes et al. | 333/154 X |
| 4,580,115 | 4/1986 | Sprengel | 333/193 X |

Primary Examiner—Paul Gensler
Attorney, Agent, or Firm—Sheldon Kanars; Jeremiah G. Murray; Maurice W. Ryan

[57] ABSTRACT

Acoustic signal processing apparatus for the frequency-partition processing of a wideband RF spectrum surface acoustic wave (SAW) input signal into a multiplicity of relatively narrowband individual contiguous acoustic wave output signals, utilizing a wideband, linearly-dispersive, slanted array input transducer arranged on a wave-conductive surface with multiple arrayed output transducers, each frequency-responsive to a respective band of frequencies emanated from the input transducer.

8 Claims, 3 Drawing Figures

WIDEBAND SAW CHANNELLIZER USING SLANTED ARRAY INPUT TRANSDUCER

STATEMENT OF GOVERNMENT INTEREST

The invention described herein may be manufactured, used, and licensed by or for the Government for governmental purposes without payment to us, or either of us, of any royalties.

BACKGROUND OF THE INVENTION

This invention relates generally to the field of surface acoustic wave (SAW) signal processing, and more particularly to a technique and apparatus for the frequency partitioning of a surface acoustic wave having a wideband RF spectrum into a multiplicity of discrete narrowband contiguous output signals. The invention is especially useful and effecacious in use with wideband early warning (EW) threat signal receivers comprised in electronic countermeasure (ECM) systems in electronic warfare, since with the present invention, any incoming threat signal can be detected, isolated, and characterized as to source.

In accordance with surface acoustic wave (SAW) technology, a mechanical ripple, or wave, travels along the surface of a substrate in much the same manner as an ocean wave travels along a body of water. These surfaces waves are both generated and detected by transducer elements which convert energy back and forth between the electrical and the mechanical domains. The base or substrate material is a piezoelectric material which acts in the normal and well known way of producing electrical voltages in response to mechanical pressures applied to crystals of the material comprising such substrate.

Radio frequency (RF) acoustic surface wave devices have certain very unique advantages over conventional electromagnetic and electronic devices. Surface acoustic wave devices, for example, may be used to effect desired time delays in signal transmission for whatever purpose may be desired. At any given frequency, an acoustic wavelength is significantly smaller than an equivalent electromagnetic wavelength by a factor in the order of 100,000. This permits the signal processing of SAW signals in devices of extremely small physical size.

It is a principle object of the present invention to provide a frequency partitioning system which is particularly useful in the detection and categorizing of a specific threat signal of interest in early warning detection in the area of electronic warfare.

A further and important object of this invention is to provide a frequency partitioning channellizing system which can be embodied in microcircuit equipment with consistently good reproducibility of the system hardware, consistently reliable results, and the ruggedness and simplicity which lends itself to utilization in military applications.

In general, the present invention comprehends apparatus for frequency partitioning and channellizing a wideband RF spectrum surface acoustic wave signal into a multiplicity of narrowband contiguous output signals and comprises, in combination, a surface wave conductive base or substrate; an input transducer on said base disposed aslant the direction of reception signal propagation; a first multiplicity of output transducers on said base arranged in spaced-apart relationship along a first longitudinally extending side of said input transducer but apart therefrom; and a second multiplicity of output transducers on said base arranged in spaced relationship along a second longitudinally extending side of said input transducer and spaced therefrom, one each of said second multiplicity of output transducers disposed opposite a space between the output transducers in said first multiplicity of output transducers.

The invention will now be described in greater particularity and detail and with reference to the appended drawing, wherein.

DETAILED DESCRIPTION OF THE INVENTION

Figure 1:
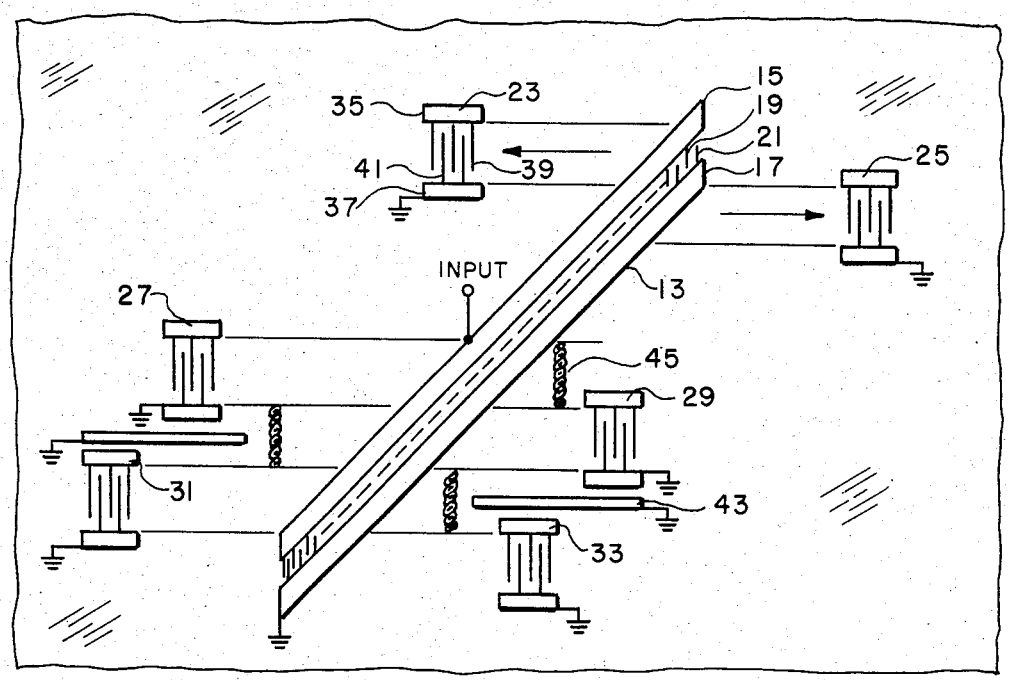
FIG. 1 is a plan view of apparatus according to the invention showing the layout of elements and circuit features comprised in an embodiment of the invention on a particular material substrate.

With reference to the drawing, FIG. 1 shows a substrate 11 of piezoelectric material, such as lithium niobate or other high coupling substrate material, on which an input transducer shown generally at 13 comprises two bus bar sections 15, 17, each respectively having fingers 19, 21, electrically connected to and extending therefrom as shown. The input transducer 13 is disposed aslant or diagonally across the surface of the substrate 11.

An array of output transducers 23, 27, 31, is arranged and disposed along the left side of the input transducer 13 as shown in the drawing while a corresponding array of output transducers 25, 29 and 33 is arranged and disposed oppositely of the first set on the other side of the slantedly oriented input transducer. Each of the output transducers comprises bus bars 35, 37 and respective sets of fingers 39, 41 extending from these base bars.

Figure 1A:
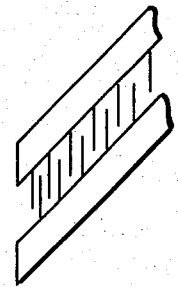
FIG. 1a is an enlarged view of a portion of FIG. 1 showing details of the input transducer bus bars and interdigitating fingers.

The fingers 19, 21 of the input transducers and 39, 41 of the output transducers, interdigitate in the arrangement shown in FIG. 1 of the drawing and in the enlarged detail of FIG. 1a of the drawing and energy launching occurs only in the areas of finger pair overlaps. The extent to which there is overlap in this arrangement is determinative of the weighting of the transducer.

Since the substrate 11 is a piezoelectric material, when an input signal is applied to the input transducer, for instance, the crystalline structure of the substrate is perturbed and an acoustic wave is launched. This wave travels over the surface of the substrate and is reconverted into electrical energy at each of the output transducers by reversal of the phenomenon, that is to say the mechanical perturbation of the substrate crystaline structure in zones contiguous to the output transducer fingers results in voltages which are electrically picked up by the fingers.

The arrangement of the output transducers 23 through 33 is, as can be appreciated from FIG. 1, staggered to provide for the physical and electrical separation of the output channels.

It has also been found advantageous in practicing our invention to provide grounded field strips 43 and surface acoustic absorbers 45 as shown in FIG. 1 between the spaced adjacent output transducers along the same side of the input transducer in order to minimize "crosstalk" between adjacent transducers and to minimize acoustic reflections, respectively.

Figure 2:
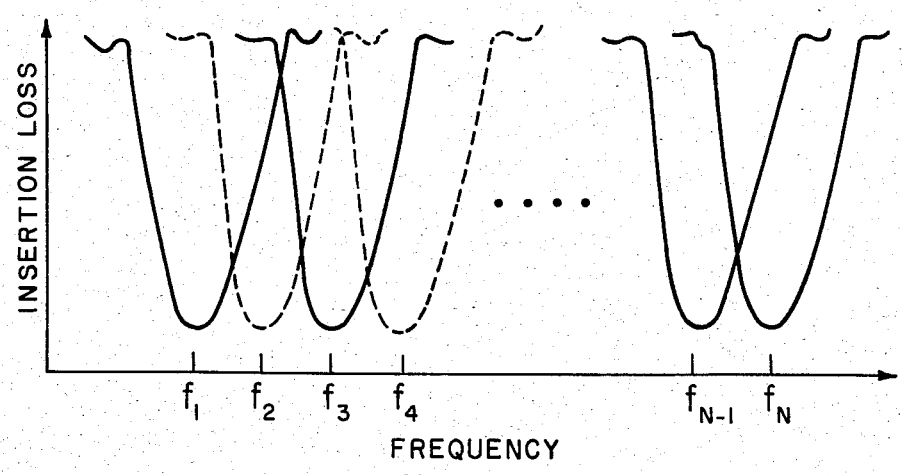
FIG. 2 is a graphic waveform illustration of an output signal response according to various frequency bands in the output of apparatus according to the invention.

The output transducers intercept the various incoming acoustic signals which correspond to the narrow band of frequencies radiated by the "N-active" electrodes in the input transducer. The number of "N-active" electrodes corresponds to the number of active electrodes at any given frequency along the linearly dispersive input array. These active sections represent a small fraction of the total number of electrodes typically included in the slanted array input transducer. This results in a relatively large number of output channels as shown in the graphic representation of FIG. 2 which illustrates the channellized contiguous output wave response.

EXAMPLE

For a demonstrable apparatus embodiment according to the invention, it can be shown that such a device operating at a mid-band frequency of 1 GHz with a bandwidth of 500 MHz and a dispersive delay of one microsecond for the input transducers, the total number of electrodes in the input array is 2000 and "N-active" electrodes=89; in accordance with conventional computations, then, the number of contiguous output channels=2000/89 or approximately 22 channels, each with a band width of approximately 22.7 MHz.

In the light of the foregoing disclosure it will be possible for persons familiar with this art to develop other alternative embodiments which will be nevertheless within the spirit of our invention. It is intended, therefore, that the foregoing spscification and the drawing be taken as illustrative only, and not construed in any limiting sense.

What is claimed is:

1. Apparatus for frequency-partitioning and channelizing a wideband RF spectrum surface acoustic wave signal into a multiplicity of narrow band contiguous acoustic output signals, comprising, in combination:
    a surface wave conductive base;
    an input transducer on said base aslant the direction of reception signal propagation:
    a first multiplicity of output transducers on said base arranged in spaced-apart relationship along a first longitudinally extending side of said input transducer and spaced therefrom;
    a second multiplicity of output transducers on said base arranged in spaced relationship along a second longitudinally extending side of said input transducer, one each of said second multiplicity of output transducers disposed opposite a space between the output transducers in said first multiplicity of output transducers, and spaced therefrom.

2. Apparatus according to claim 1 in combination with
    a multiplicity of grounded radiation shield means disposed one each respectively between each pair of linearly adjacent output transducers comprised in said first and said second multiplicities of output transducers.

3. Apparatus according to claim 1 in combination with
    a multiplicity of acoustic absorber means disposed, one each respectively, between each pair of linearly adjacent output transducers comprised in said first and said second multiplicities of output transducers.

4. Apparatus according to claim 2 in combination with
    a multiplicity of acoustic absorber means disposed, one each respectively, between each pair of linearly adjacent output transducers comprised in said first and said second multiplicities of output transducers.

5. Apparatus according to claim 1 wherein the surface wave conductive base is made of a piezoelectric material.

6. Apparatus according to claim 2 wherein the surface wave conductive base is made of a piezoelectric material.

7. Apparatus according to claim 3 wherein the surface wave conductive base is made of a piezoelectric material.

8. Apparatus according to claim 4 wherein the surface wave conductive base is made of a piezoelectric material.

* * * * *